United States Patent
Liaw et al.

(10) Patent No.: US 6,228,731 B1
(45) Date of Patent: May 8, 2001

(54) RE-ETCHED SPACER PROCESS FOR A SELF-ALIGNED STRUCTURE

(75) Inventors: Jhon-Jhy Liaw; Yun-Hung Shen, both of Taipei (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/374,817

(22) Filed: Aug. 16, 1999

(51) Int. Cl.[7] .................................................. H01L 21/336
(52) U.S. Cl. ........................ 438/303; 438/299; 438/301; 438/304; 438/305; 438/597
(58) Field of Search ................................. 438/597, 299, 438/301, 303, 304–307

(56) References Cited

U.S. PATENT DOCUMENTS

| | | | |
|---|---|---|---|
| 5,292,677 | * 3/1994 | Dennison . | |
| 5,472,890 | * 12/1995 | Oda . | |
| 5,605,864 | 2/1997 | Prall | 437/195 |
| 5,654,236 | 8/1997 | Kasai | 438/639 |
| 5,723,381 | 3/1998 | Grewal et al. | 438/633 |
| 5,728,595 | 3/1998 | Fukase et al. | 437/44 |
| 5,728,596 | 3/1998 | Prall | 437/52 |
| 5,731,236 | 3/1998 | Chou et al. | 438/253 |
| 5,741,396 | * 4/1998 | Loewenstein . | |
| 5,759,867 | 6/1998 | Armacost et al. | 437/195 |
| 5,759,920 | * 6/1998 | Burns, Jr. et al. . | |
| 5,763,316 | * 6/1998 | Chen et al. . | |
| 5,891,799 | * 4/1999 | Tsui . | |
| 6,037,228 | * 3/2000 | Hsu . | |
| 6,140,183 | * 10/2000 | Osanai . | |
| 6,153,455 | * 11/2000 | Ling et al. . | |
| 6,153,457 | * 11/2000 | Kuo . | |

* cited by examiner

Primary Examiner—Charles Bowers
Assistant Examiner—Stephen W. Smoot
(74) Attorney, Agent, or Firm—George O. Saile; Stephen B. Ackerman

(57) ABSTRACT

A process for forming a self-aligned contact, (SAC), structure, on an active device region in a semiconductor substrate, exposed at the bottom of a SAC opening in an insulator layer, has been developed. The process features increasing the area of the active device region, used to accommodate the overlying SAC structure, via the selective removal of the thick spacer component, of a composite spacer, located on the sides of silicon nitride capped, gate structures, performed after definition of a heavily doped source/drain region. The thick spacer component can be a polysilicon shape overlying a thin silicon oxide shape, or the thick spacer component can be a silicon oxide shape, overlying a silicon nitride shape.

22 Claims, 7 Drawing Sheets

RE-ETCHED SPACER PROCESS FOR A SELF-ALIGNED STRUCTURE

BACKGROUND OF THE INVENTION (1) Field of the Invention

The present invention relates to methods used to fabricate semiconductor devices, and more specifically to a method used to fabricate a metal silicon oxide field effect transistor, (MOSFET), device, featuring a self-aligned contact, (SAC), structure.

(2) Description of Prior Art

Static random access memory, (SRAM), cells are usually comprised of six MOSFET devices, preferably four NFET, (n channel), devices, and two PFET, (p channel), devices. In general, to decrease the cost of semiconductor chips, the cell size, or SRAM cells in this case, have to be decreased, to allow a greater amount of smaller semiconductor chips to be obtained from a specific size starting substrate, thus reducing the processing cost of each specific semiconductor chip, however with the now smaller SRAM cell, still supplying the device density and performance obtained with SRAM cells fabricated with larger features. Therefore to decrease SRAM cell size, the size of the PFET and NFET devices have to be reduced.

Micro-miniaturization, or the use of sub-micron features, obtained via optimization of specific fabrication disciplines, such as photolithography, and dry etching, have allowed the objective of smaller MOSFET devices, to be partially realized. However the use of specific design and structural innovations, such as a self-aligned opening, and a self-aligned contact, structure, have also contributed to the attainment of smaller SRAM devices, and cells, resulting in smaller, less expensive, SRAM semiconductor chips. When using conventional, or non-SAC hole opening procedures, to expose an underlying active device region, in a semiconductor substrate, the area of the active device region has to be increased to insure that this opening is fully landed on this region. This results in an increase in the designed dimension of the active device region, resulting in larger than desired cells, or chips. The SAC procedure however, as applied to an active device region such as a source/drain region, is comprised of an opening larger in diameter than the space between gate structures, where a source/drain region is located. This is accomplished via selective reactive ion etching, (RIE), procedures allowing the SAC opening to expose a portion of the top surface of insulator capped, gate structures, as well as the active device region, located between the insulator capped gate structures.

This invention will describe a procedure in which a SAC opening is made to a small designed space between insulator capped gate structures, with composite spacers on the sides of the gate structures. After definition of an active device region, such as a source/drain region, the space is enlarged via the removal of a component of the composite spacer. This process sequence allows the amount of designed active device area, needed to accommodate the SAC opening, to be reduced, however still allowing the needed amount of contact area when filled with an overlying SAC structure, due to the removal of a component of the composite spacer. Prior art, relating to SAC procedures, such as Chou et al, in U.S. Pat. No. 5,731,236, describe a SAC structure, however without the novel re-etched, or removed, spacer component, used in the present invention to increase device density.

SUMMARY OF THE INVENTION

It is an object of this invention to use SAC openings to expose active device regions in MOSFET devices.

It is another object of this invention to form an active device region in an area of a semiconductor substrate, defined by gate structures, and by composite spacers on the sides of the gate structures.

It is still another object of this invention to increase the area of the active device region, needed to accommodate a fully landed, SAC opening, by removing a component of the composite spacers, located on the sides of the gate structures, after formation of the active device region.

It is still yet another object of this invention to use polysilicon as the removable component of the spacers, located on the sides of the gate structures.

In accordance with the present invention a process for forming a SAC opening, to an active device region in a semiconductor substrate, located between gate structures, and featuring the removal of a polysilicon component of a composite sidewall spacer, located on the sides of the gate structures, performed to increase the area needed for the fully landed SAC opening, is described. After formation of silicon nitride capped, gate structures, on an underlying gate insulator layer, a lightly doped source/drain region is formed in a region of the semiconductor substrate, defined by the silicon nitride capped, gate structures. A thin silicon oxide layer is next formed on the surface of the lightly doped source/drain region, as well as on the sides of the silicon nitride capped, gate structures. A polysilicon layer is next deposited, followed by an anisotropic RIE procedure, creating a composite spacer, on the sides of the silicon nitride capped, gate structures, comprised of an overlying polysilicon shape, and an underlying, thin silicon oxide layer. After formation of a heavily doped source/drain region, in an region of the semiconductor substrate, defined by the silicon nitride capped, gate structures, and by the composite spacers, a thin silicon nitride stop layer, and an overlying, interlevel dielectric, (ILD), layer, are deposited. A self-aligned contact, (SAC), opening is then selectively formed in the ILD layer, and in the thin silicon nitride stop layer, exposing the thin silicon oxide layer, overlying the heavily doped source/drain region, located between the composite spacers, on the silicon nitride capped, gate structures. The SAC opening also exposes the top surface of the silicon nitride capped, gate structures, in a region adjacent to the space between the silicon nitride capped, gate structures. The polysilicon component, of the composite spacer, is then selectively removed, increasing the space between silicon nitride capped, gate structures. A thin insulator spacer is next formed on the sides of the SAC opening, followed by the creation of a metal structure, in the SAC opening, overlying, and contacting, the active device region, located between the silicon nitride capped, gate structures.

A second embodiment of this invention features the use of a composite spacer, comprised with an underlying a silicon nitride shape, and an overlying silicon oxide shape, defining the heavily doped source/drain region. During the SAC opening, and during the clean procedures, used to remove polymer generated during the SAC, dry etching procedure, the silicon oxide shape, of the composite spacer, is removed. The subsequent formation of a silicon nitride spacer, on the sides of the SAC opening, result in increased surface area at the bottom of the SAC opening, allowing increased contact between an overlying SAC metal structure, and the underlying active device region.

BRIEF DESCRIPTION OF THE DRAWINGS

The object and other advantages of this invention are best described in the preferred embodiments with reference to the attached drawings.

DESCRIPTION OF THE PREFERRED EMBODIMENTS

Figure 1:
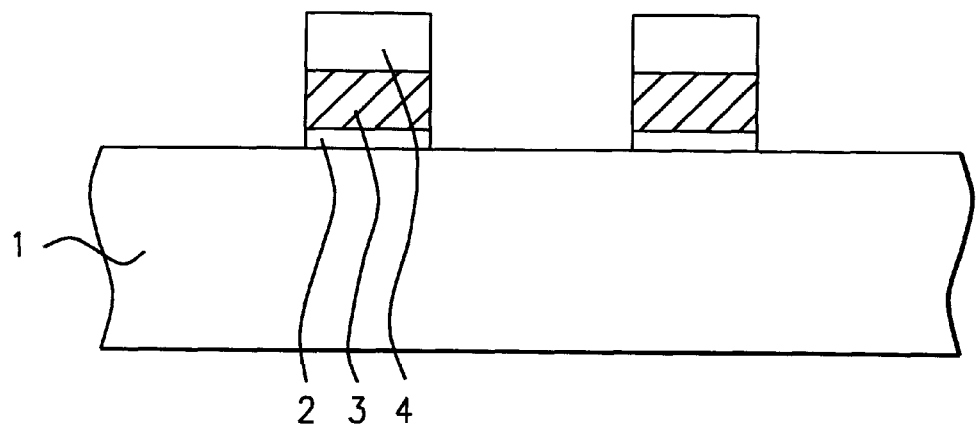
FIGS. 1–10, which schematically, in cross-sectional style, show key stages of fabrication used to create a SAC opening, to an active device region, in a semiconductor substrate, in which the area of the active device region, needed to accommodate the fully landed SAC opening, has been increased via removal of a polysilicon component, of a composite spacer, after formation of a heavily doped source/drain region.

The method of forming a SAC opening, in a composite insulator layer, to expose an active device region, in a region of a semiconductor substrate, located between gate structures, and featuring the selective removal of a polysilicon component, of a composite spacer, residing on the sides of the gate structure, after the formation of a heavily doped source/drain region, will now be described in detail. A P type, semiconductor substrate 1, comprised of single crystalline silicon, with a <100> crystallographic orientation, is used and schematically shown in FIG. 1. A gate insulator layer 2, comprised of silicon dioxide is thermally grown to a thickness between about 15 to 200 Angstroms. A polysilicon layer 3, is next deposited via low pressure chemical vapor deposition, (LPCVD), procedures, at a thickness between about 500 to 3000 Angstroms. Polysilicon layer 3, can be doped in situ, during deposition, via the addition of arsine, or phosphine, to a silane ambient, or polysilicon layer 3, can be deposited intrinsically, then doped via an ion implantation procedure, using arsenic, or phosphorous ions. A silicon nitride layer 4, obtained via LPCVD or via plasma enhanced chemical vapor deposition, (PECVD), is the formed at a thickness between about 1000 to 2500 Angstroms. Conventional photolithographic and anisotropic reactive ion etching, (RIE), procedures, using $Cl_2$ as an etchant, are used to form the silicon nitride capped, gate structures shown schematically in FIG. 1, comprised of silicon nitride layer 4, on polysilicon layer 3. If greater conductivity is desired, polysilicon layer 3, can be replaced by a polycide, (metal silicide-polysilicon), layer. Removal of the photoresist shape used to define the silicon nitride capped, gate structures, is accomplished via plasma oxygen ashing and careful wet cleans.

Figure 2:
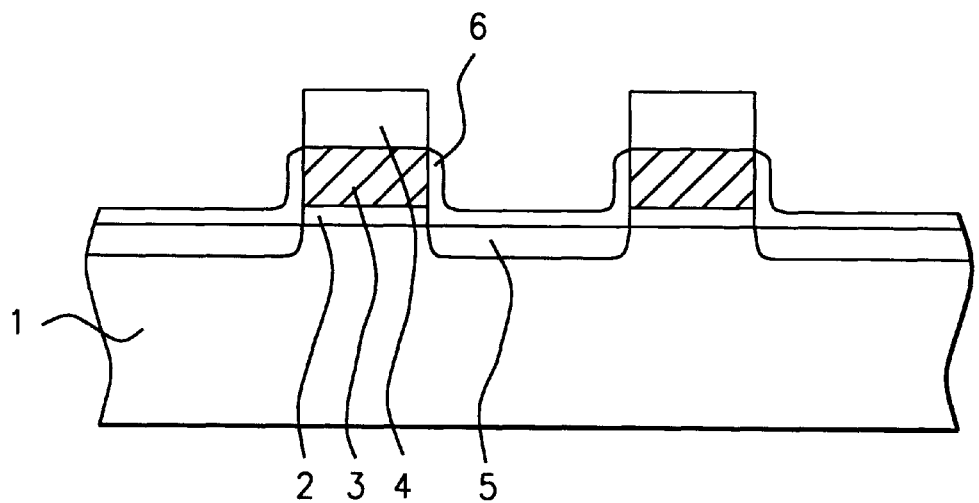

This invention can be applied to static random access memory, (SRAM), cells, comprised with both NFET and PFET devices. In this invention the SAC opening, and the removable polysilicon component of the composite spacer shapes, will be described using only NFET devices. However this SAC opening sequence, while being applied to the NFET devices of an SRAM cell, can be simultaneously applied to the PFET devices, of the SRAM cell. An N type, lightly doped source/drain region 5, is formed in a region of semiconductor substrate 1, not covered by the silicon nitride capped, gate structures, via ion implantation of arsenic, or phosphorous ions, at an energy between about 5 to 60 KeV, at a dose between about 5E12 to 1E15 atoms/$cm^2$. Again if PFET devices are used, an N well region would be formed in the subsequent PFET region, and P type, lightly doped source/drain regions, would be formed in an area of the N well region, not covered by the silicon nitride capped, gate structures. A critical silicon oxide layer 6, is next formed via a thermal anneal procedure, performed in an oxygen ambient, resulting in the formation of silicon oxide layer 6, at a thickness between about 100 to 200 Angstroms, on the sides of the polysilicon component of the silicon nitride capped, gate structures, as well as on the top surface of lightly doped source/drain region 5. This is schematically shown in FIG. 2. If desired silicon oxide layer 6, can be obtained via LPCVD or PECVD procedures, at a thickness between about 100 to 300 Angstroms. This option, not shown in the drawings, would result in silicon oxide layer 6, on the sides of the silicon nitride component of the silicon nitride capped, gate structures, as well as residing on the sides of the polysilicon component.

Figure 3:
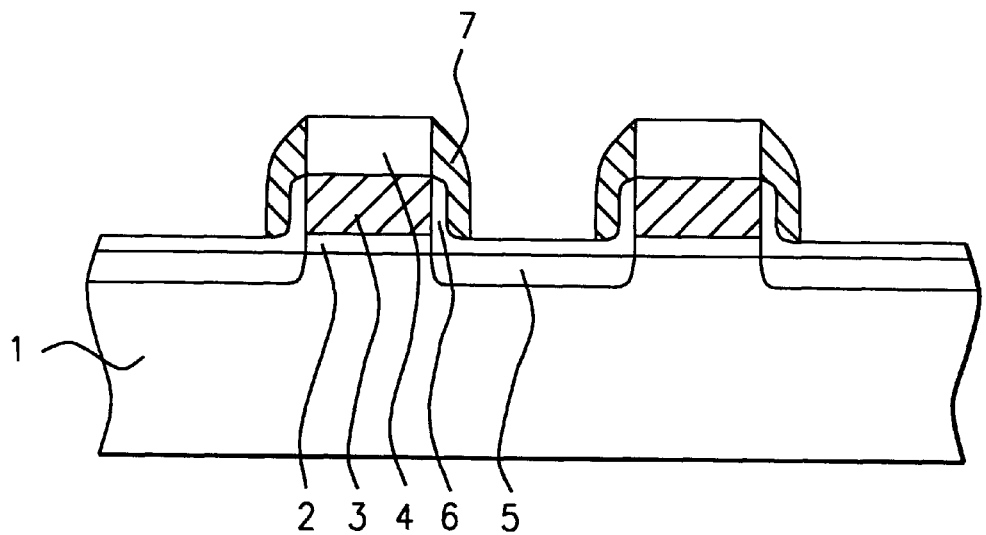
Figure 4:
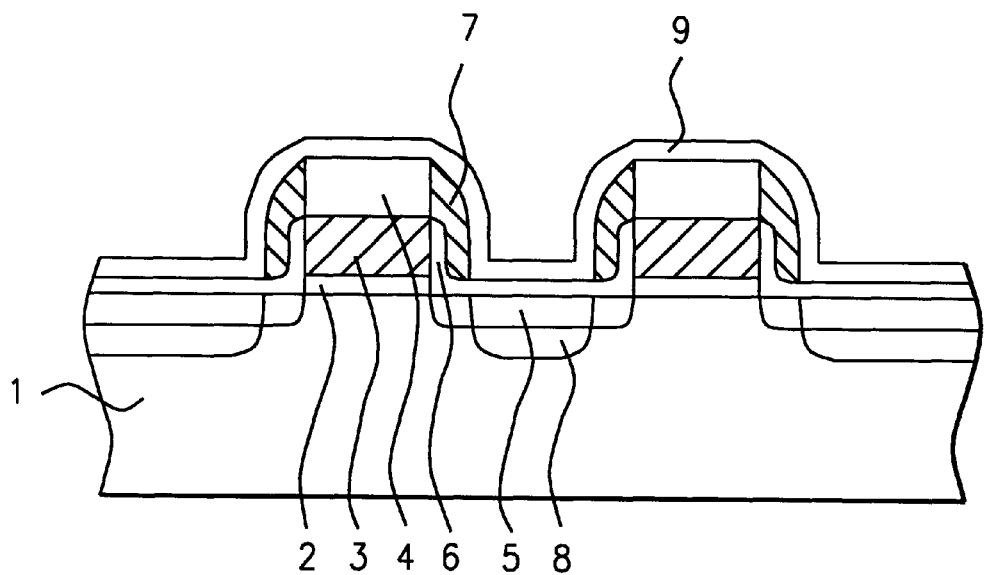

FIG. 3, schematically shows the creation of a composite spacer, on the sides of the silicon nitride capped, gate structures. A polysilicon layer, is deposited, via LPCVD procedures, at a thickness between about 500 to 1500 Angstroms. An anisotropic RIE procedure, using $Cl_2$ as an etchant, is then used to create the composite spacer, comprised of polysilicon shape 7, and silicon oxide layer 6, on the sides of the silicon nitride capped, gate structures. Heavily doped, source/drain region 8, shown schematically in FIG. 4, is next formed in a region of semiconductor substrate 1, not covered by the silicon nitride capped, gate structures, or by the composite spacers, via the ion implantation of arsenic, or phosphorous ions, at an energy between about 5 to 60 KeV, at a dose between about 1E15 to 1E16 atoms/$cm^2$. As previously stated, the PFET devices are subjected to the formation of P type, heavily doped, source/drain regions, formed in regions of the N well region, again not covered by the silicon nitride capped, gate structures, or by the composite spacers. This is not shown in the drawings. A thin silicon nitride layer 9, is next deposited via PECVD or LPCVD procedures, at a thickness between about 100 to 400 Angstroms. This is schematically shown in FIG. 4.

Figure 5:
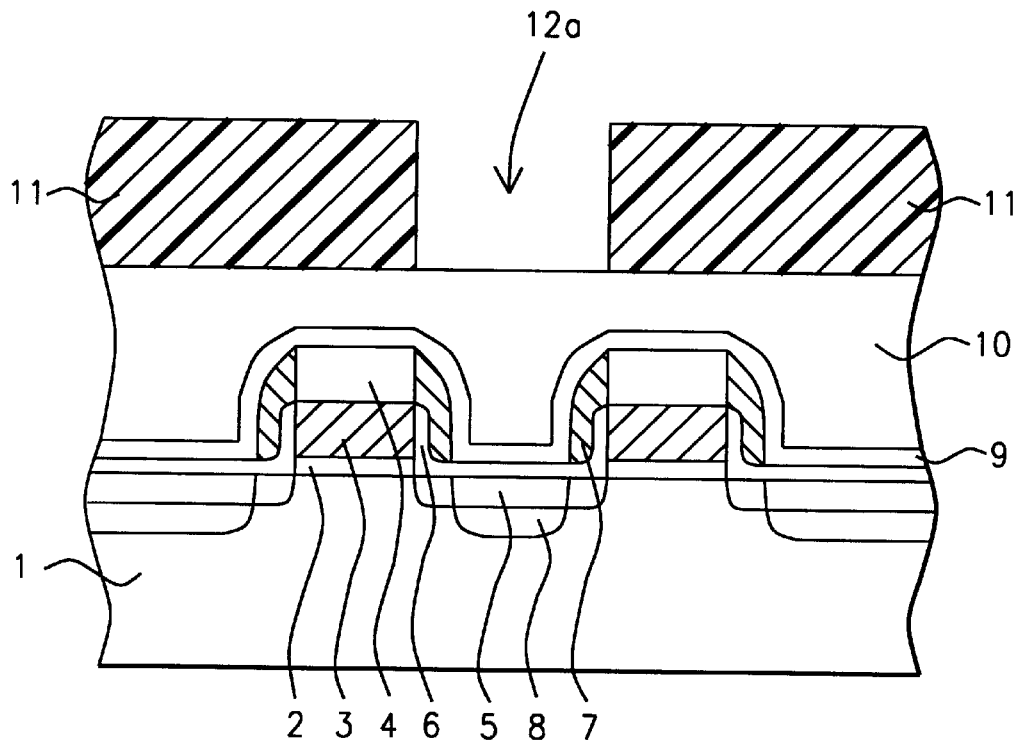

An interlevel dielectric layer, (ILD), 10, is next deposited, comprised of an underlying layer of undoped silicon oxide, obtained via PECVD procedures, using tetraethylorthosilicate, (TEOS), as a source, at a thickness between about 1000 to 2000 Angstroms, and comprised of an overlying layer of a borophosphosilicate glass layer, obtained via PECVD procedures, at a thickness between about 3000 to 12000 Angstroms. ILD layer 10, shown schematically in FIG. 5, can be planarized, if desired, via a chemical mechanical polishing procedure, resulting in a smooth top surface topography for ILD layer 10. Photoresist shape 11, is next formed on ILD layer 10, featuring opening 12a, directly overlying the space between silicon nitride capped, gate structures. Opening 12a, shown schematically in FIG. 5, with a diameter greater than the space between silicon nitride capped, gate structures, will be used as the feature for definition of a subsequent SAC opening.

Figure 6:
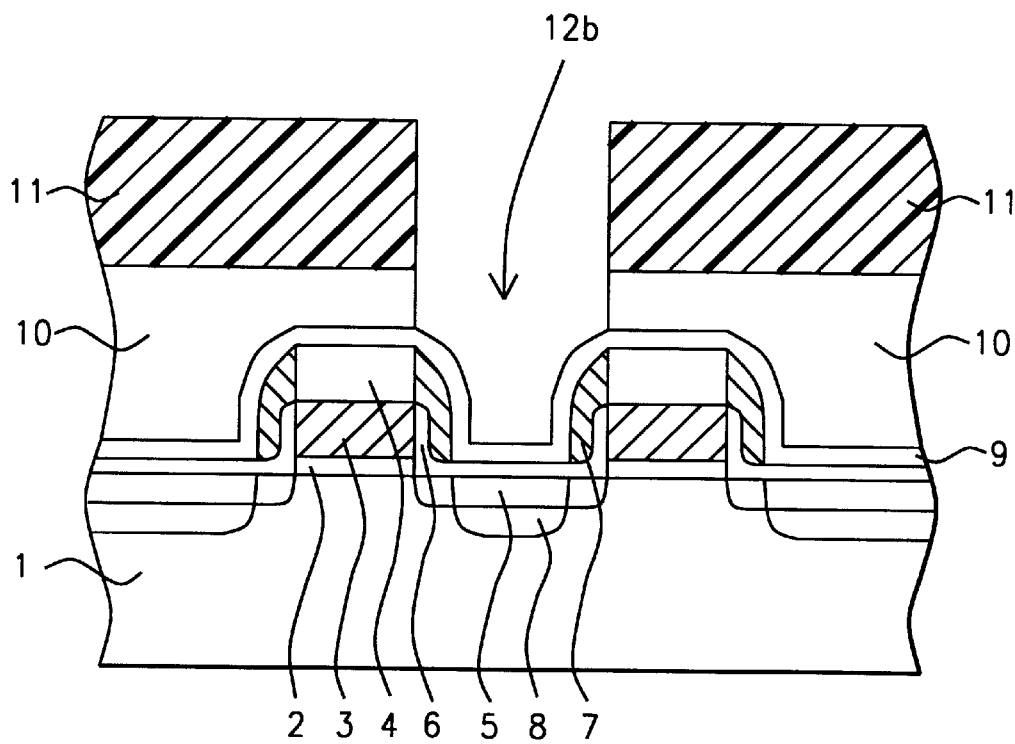
Figure 7:
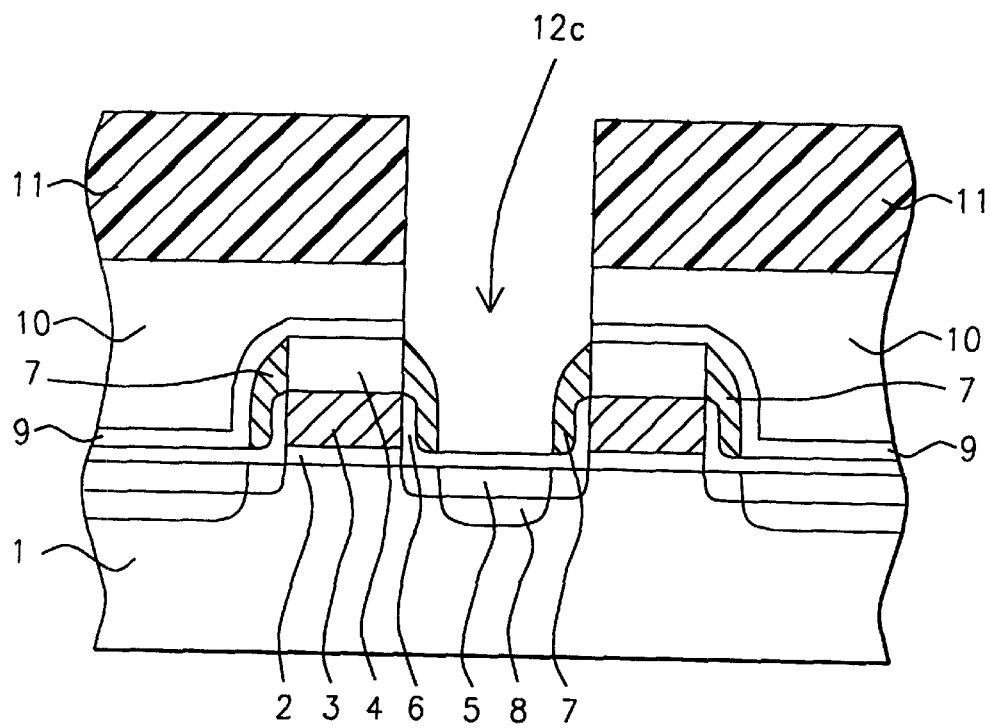

A selective, anisotropic RIE procedure, using $CHF_3$ as an etchant, is used to transfer opening 12a, in photoresist shape 11, to ILD layer 10, creating SAC opening 12b, in ILD layer 10. This is schematically shown in FIG. 6. The selectivity, or etch rate ratio, of silicon oxide, (ILD layer 10), to silicon nitride, using $CHF_3$ as an etchant is about 15 to 1, allowing this phase of the SAC opening procedure, to stop at the appearance of underlying silicon nitride layer 9. With photoresist shape 11, still in place, selective removal of regions of silicon nitride layer 9, exposed in SAC opening 12b, are removed via a selective, isotropic dry etching procedure, using $CHF_3$—Ar as an etchant. The etch rate ratio of silicon nitride to silicon oxide, or to polysilicon, using this etchant, is between about 5 to 10, to 1, allowing the selective removal of exposed regions of silicon nitride regions 9, resulting in SAC opening 12c, shown schematically in FIG. 7. If desired photoresist shape 11, can be removed prior to removal of silicon nitride layer 9, followed by the isotropic dry etch procedure, again using $C_4F_8$ as an etchant to selectively remove silicon nitride layer 9, from the surface of polysilicon shape 7, and from the surface of silicon oxide layer 6.

Figure 8:
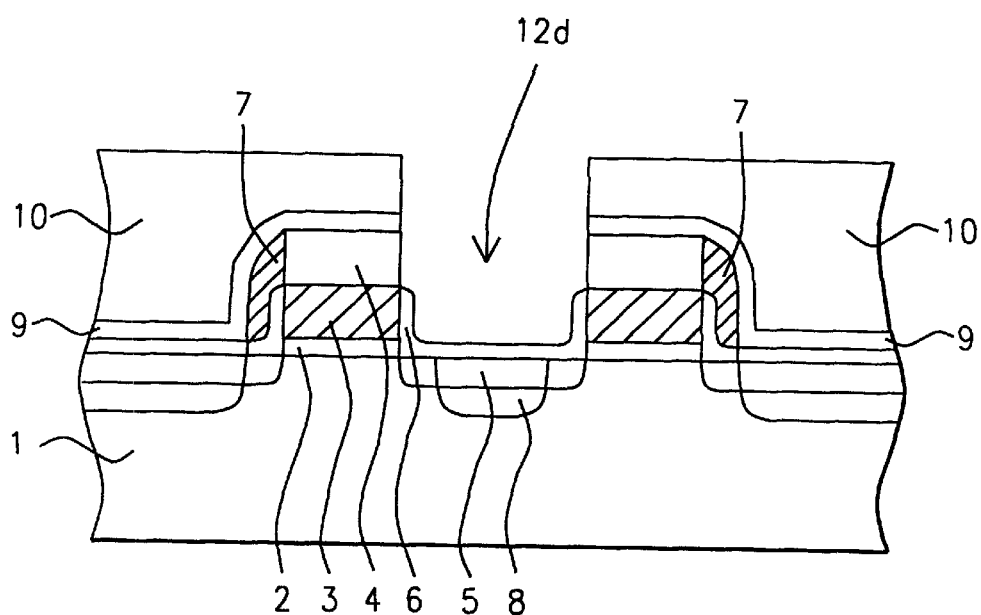

The removal of polysilicon shape 7, is next addressed and schematically shown in FIG. 8. Again if desired, with photoresist shape 11, still in place, a selective, isotropic dry etch procedure, using $Cl_2$ as an etchant, can be used to selectively remove polysilicon shape 7, without attack of underlying silicon oxide layer 6. Another option is to remove photoresist shape 11, via plasma oxygen ashing and careful wet cleans, then remove polysilicon shape 7, via the isotropic dry etch procedure, using $Cl_2$ as an etchant. Either option results in the creation of SAC opening 12d, shown schematically in FIG. 8. SAC opening 12d, now larger in diameter as a result of the removal of the polysilicon component of the composite spacers, will allow a subsequent, wider SAC structure to be placed in the SAC opening, resulting in a lower contact resistance interface, than was possible if the SAC structure was placed in narrower diameter SAC openings.

Figure 9:
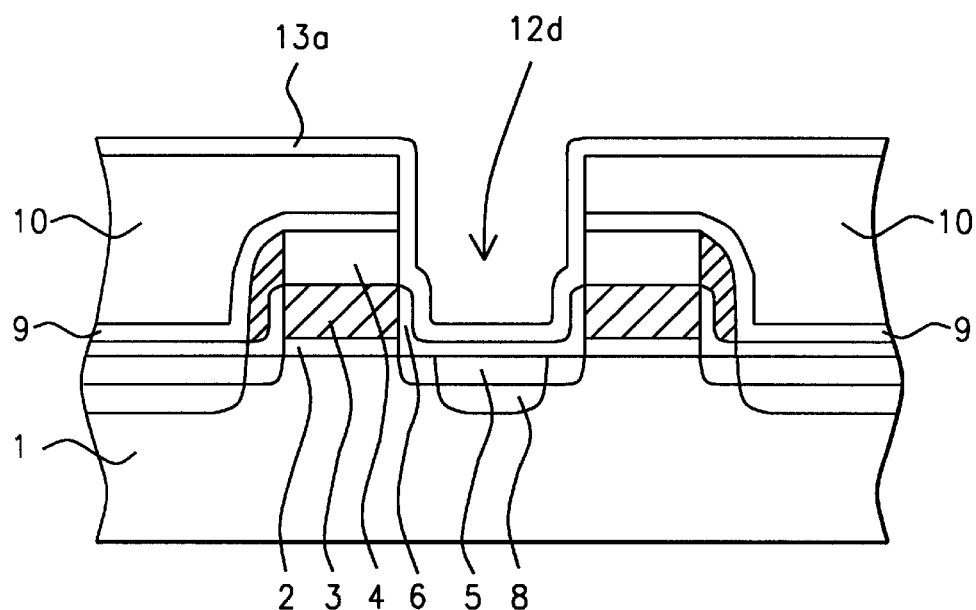
Figure 10:
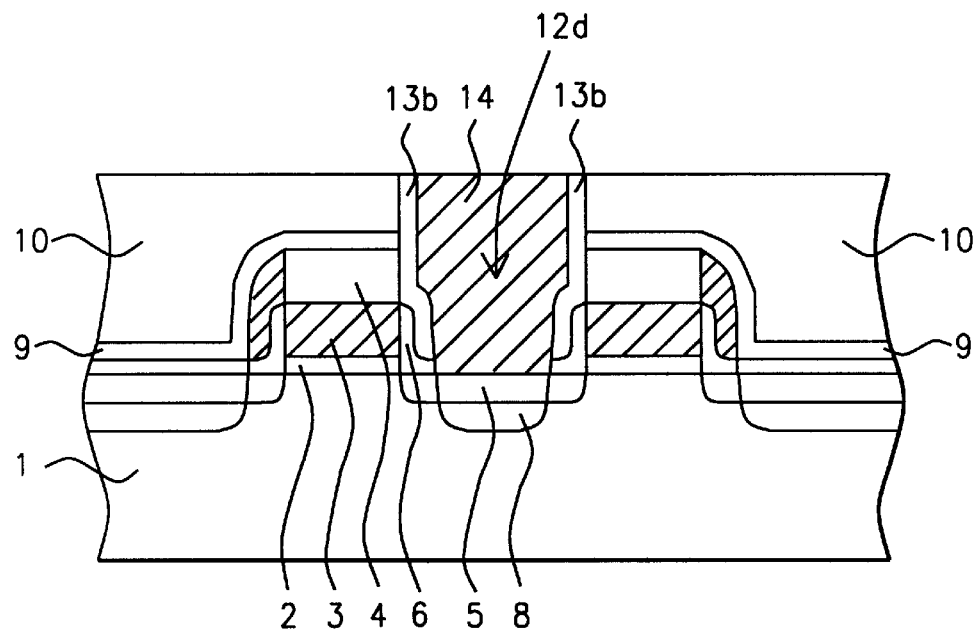

Dielectric layer 13a, comprised of either silicon nitride, or silicon oxide, is deposited, via PECVD or LPCVD procedures, to a thickness between about 50 to 300 Angstroms, coating the sides of SAC opening 12d. This is schematically shown in FIG. 9. An anisotropic RIE procedure is then employed, using $CHF_3$—Ar as an etchant, to create insulator spacers 13b, on the sides of SAC opening 12d, and to remove silicon oxide layer 6, located at the bottom of SAC opening 12d. SAC structure, or plug structure 14, schematically shown in FIG. 10, is next formed in SAC opening 12d. The SAC structure is comprised of a tungsten plug, encased in a composite adhesive—barrier layer, comprised of titanium-titanium nitride. This is obtained via deposition of the composite, titanium-titanium nitride layer, via plasma vapor deposition, or via chemical vapor deposition procedures, at a thickness between about 100 to 1500 Angstroms. A chemical vapor deposition of tungsten follows, at a thickness between about 2000 to 5000 Angstroms, completely filling SAC opening 12d. Removal of unwanted metal, from the top surface of ILD layer 10, is accomplished via a chemical mechanical polishing procedure, or via a selective RIE procedure, using $Cl_2$ as an etchant, resulting in the formation of SAC structure, or plug structure 14, in SAC opening 12d, and with the contact resistance of this interface, decreased as a result of the increased diameter of SAC opening 12d, in turn accomplished via the removal of the polysilicon shapes, in the composite spacers.

Figure 11:
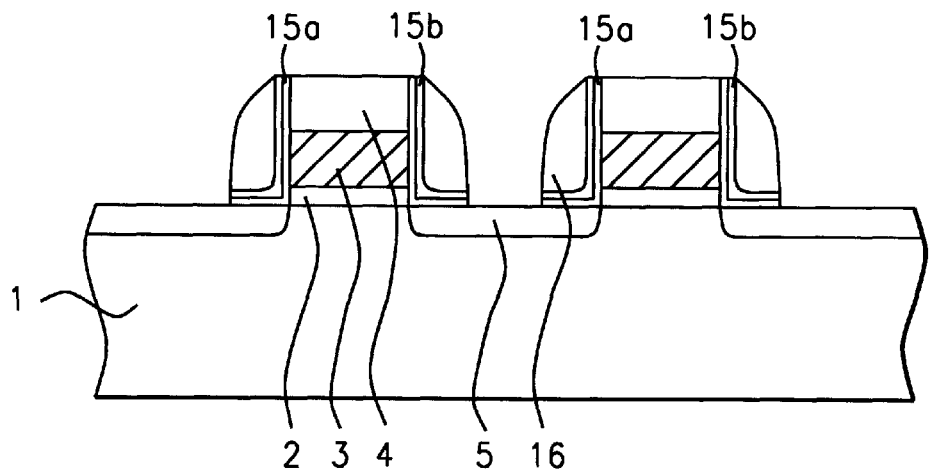
FIGS. 11–14, which schematically, in cross-sectional style, show the key stages of fabrication, of a second embodiment of this invention, featuring the removal of a silicon oxide component, of a composite spacer, again used to increase the area of the active device region, to be overlaid with a SAC structure.

A second embodiment of this invention is next described, and shown schematically in FIGS. 11–14. Referring to FIG. 11, the silicon nitride capped, gate structures, previously described, are again used, however after formation of lightly doped source/drain region, a composite insulator layer is formed. This is accomplished via the deposition of a low pressure, silicon oxide layer, 15a, (LPTEOS), via LPCVD or PECVD procedures, at a thickness between about 230 to 270 Angstroms, using tetraethylorthosilicate, (TEOS), as a source. The deposition of low pressure silicon nitride layer 15b, (LPSiN), via LPCVD or PECVD procedures, at a thickness between about 280 to 320 Angstroms, is followed by the deposition of a silicon oxide layer 16, (LPTEOS), also obtained via LPCVD or PECVD procedures, at a thickness between about 900 to 1100 Angstroms, using TEOS as a source. An anisotropic RIE procedure, using $CF_4$—$CHF_3$—Ar, as an etchant is next employed to create the composite spacers, comprised of overlying silicon oxide shape 16, and silicon nitride shape 15b, and silicon oxide shape 15a, located on the sides of the silicon nitride capped, gate structures.

Figure 12:
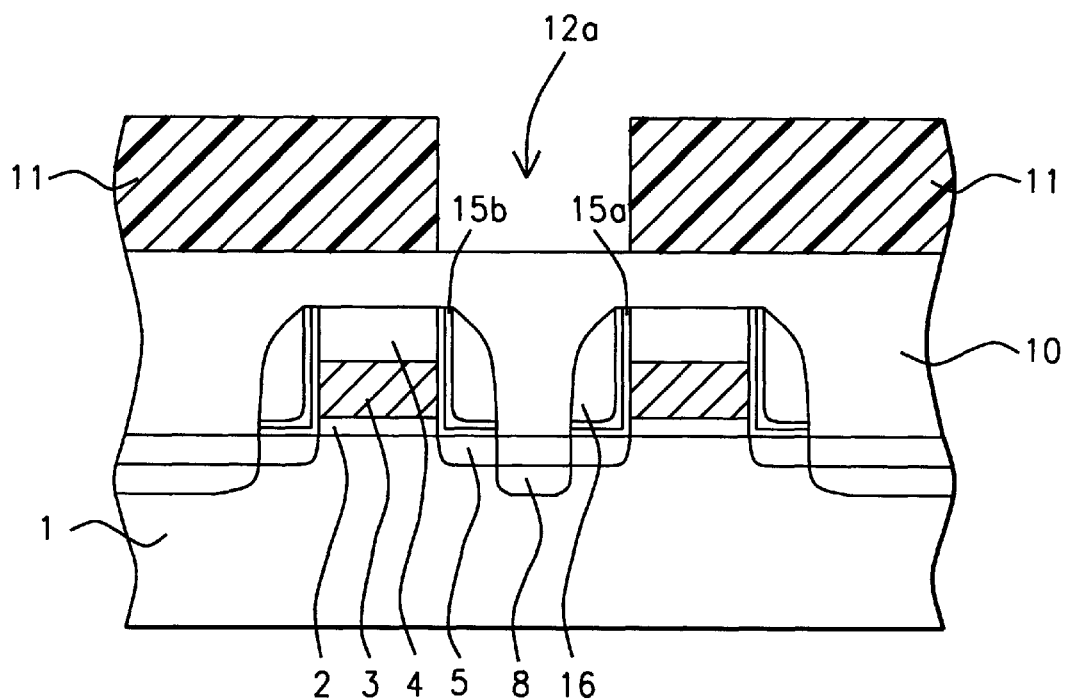
Figure 13:
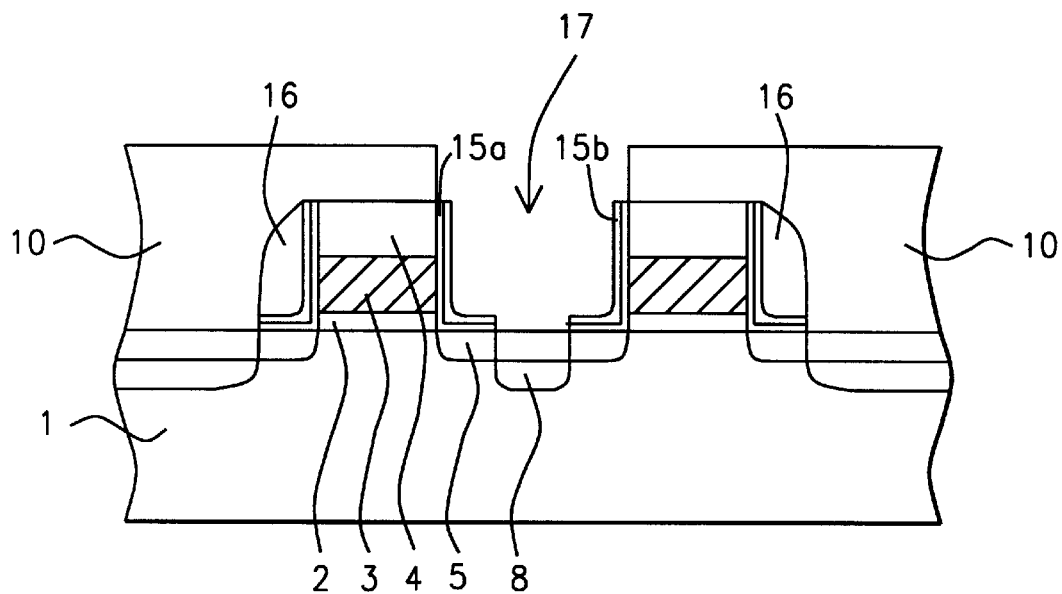
Figure 14:
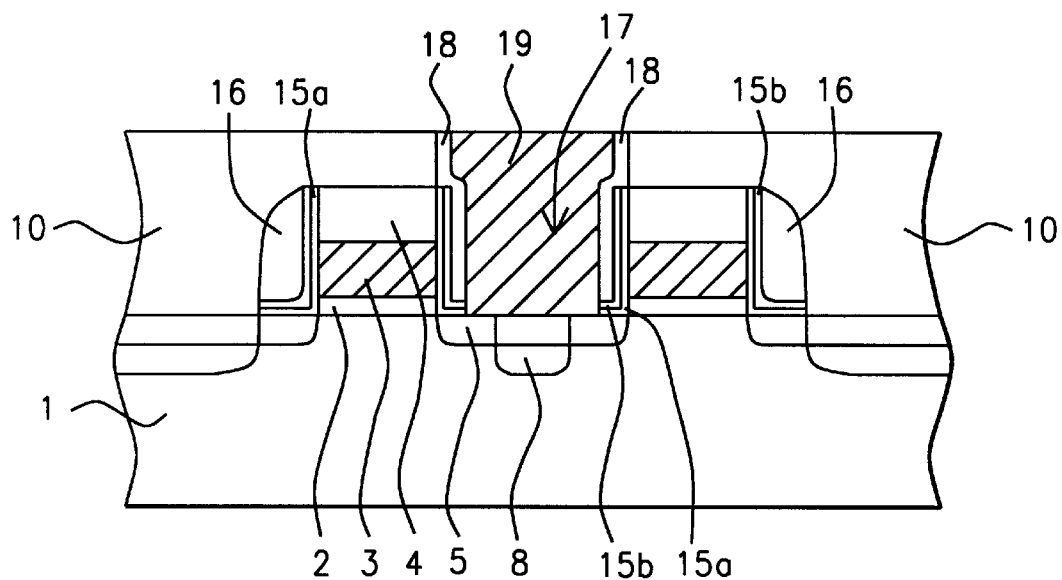

After formation of heavily doped source/drain region 8, defined by the composite spacers, the deposition of, and planarization of, ILD layer 10, identical to the procedures previously described in the first embodiment of this invention, is performed. This is followed by the formation of photoresist shape 11, with opening 12a, on ILD layer 10, with opening 12a, directly overlying the space between silicon nitride capped, gate structures. This is schematically shown in FIG. 12. An anisotropic RI F procedure, using $CHF_3$ as an etchant, is used to create SAC opening 17, in ILD layer 10. This is schematically shown in FIG. 13. During the SAC opening procedure, and during a post RIE clean procedure, used to remove polymer and scum, generated during the RIE procedure, used to create SAC opening 17, silicon oxide shape 16, is totally removed from the opening. Second silicon nitride spacer 18, are then formed on the sides of SAC opening 17, via deposition of a silicon nitride layer, via LPCVD or PECVD procedures, at a thickness between about 250 to 350 Angstroms, followed by an anisotropic RIE procedure, performed using $CF_4$—$CHF_3$—Ar as an etchant. This RIE procedure also removes the portion of silicon nitride shape 15b and silicon oxide shape 15a, that was previously covered by silicon oxide shape 16, resulting in an increase in the surface area of the active device region, exposed at the bottom of SAC opening 17. This is schematically shown in FIG. 14. The formation of metal structure 19, in SAC opening 17, is identical in materials, and processes, previously used, and described in FIG. 10.

While this invention has been particularly shown and described with reference to, the preferred embodiments thereof, it will be understood by those skilled in the art that various changes in form and details may be made without departing from the spirit and scope of this invention.

What is claimed is:

1. A method of forming a self-aligned contact, (SAC), structure, on an active device region located in a semiconductor substrate, comprising the steps of:

providing silicon nitride capped, gate structures, on a gate insulator layer, with a lightly doped source/drain region, located in a region of said semiconductor substrate not covered by said silicon nitride capped, gate structures;

forming a silicon oxide layer, on the sides of said silicon nitride capped, gate structures, and on the surface of said lightly doped source/drain region, exposed in the space between said silicon nitride capped, gate structures;

depositing a polysilicon layer then forming composite spacers on the sides of said silicon nitride capped, gate structures, comprised of a polysilicon shape, overlying the portion of said silicon oxide layer, located on the sides of said silicon nitride capped, gate structures;

forming a heavily doped source/drain region in an area of said semiconductor substrate, not covered by said silicon nitride capped, gate structures, and not covered by said composite spacers;

depositing a disposable silicon nitride stop layer over said silicon nitride capped, gate structures, said composite spacers, and said heavily doped source/drain region;

depositing an interlevel dielectric layer (ILD) over said disposable silicon nitride stop layer;

forming a SAC opening in said ILD layer, wherein said SAC opening stops at said disposable silicon nitride stop layer and thereby exposing portions of said disposable silicon nitride stop layer within said SAC opening;

selectively removing said exposed portions of said disposable silicon nitride stop layer;

selectively removing said polysilicon shape;

forming insulator spacers on the sides of said SAC opening, and removing the region of said silicon oxide layer, located in the space between said silicon nitride capped, gate structures; and forming said SAC structure, in said SAC opening.

2. The method of claim 1, wherein said silicon oxide layer, formed on the sides of said silicon nitride capped, gate structures, and on the surface of said lightly doped source/drain region, is obtained via a thermal oxidation procedure, to a thickness between about 100 to 200 Angstroms.

3. The method of claim 1, wherein said silicon oxide layer, formed on the sides of said silicon nitride capped, gate structures, and on the surface of said lightly doped source/drain region, is obtained via LPCVD or PECVD procedures, to a thickness between about 100 to 300 Angstroms.

4. The method of claim 1, wherein said polysilicon layer is obtained via LPCVD procedures, at a thickness between about 500 to 1500 Angstroms.

5. The method of claim 1, wherein said composite spacers are formed via an anisotropic RIE procedure, applied to said polysilicon layer, using $Cl_2$ as an etchant, creating said polysilicon shape, of said composite spacers.

6. The method of claim 1, wherein said silicon nitride stop layer is obtained via LPCVD or PECVD procedures, at a thickness between about 100 to 400 Angstroms.

7. The method of claim 1, wherein said ILD layer is comprised of an underlying layer of silicon oxide, obtained via PECVD procedures, at a thickness between about 1000 to 2000 Angstroms, using TEOS as a source, and comprised of an overlying layer of borophosphosilicate glass, obtained via PECVD procedures, at a thickness between about 3000 to 12000 Angstroms, using TEOS as a source.

8. The method of claim 1, wherein said SAC opening, in said ILD layer, is formed via an anisotropic RIE procedure, using $CHF_3$ as an etchant, with an etch rate ratio of silicon oxide, (ILD layer), to said silicon nitride stop layer, of about 15 to 1.

9. The method of claim 1, wherein said silicon nitride stop layer is removed via a blanket, isotropic dry etching procedure, using $CHF_3$—Ar as an etchant, with an etch rate ratio between said silicon nitride stop layer, to said silicon oxide layer, between about 5 to 10, to 1.

10. The method of claim 1, wherein said polysilicon shape is removed via a blanket isotropic dry etching procedure, using $Cl_2$ as an etchant.

11. The method of claim 1, wherein said insulator spacers, on the sides of said SAC opening, are comprised of either silicon nitride, or silicon oxide, at a thickness between about 50 to 300 Angstroms.

12. The method of claim 1, wherein said SAC structure, in said SAC opening, is a tungsten plug structure, encased with a composite adhesive—barrier layer, comprised of a titanium-titanium nitride, composite layer.

13. A method of forming a SAC structure, on an active device region in a semiconductor substrate, in which the area of said active device region, underlying said SAC structure, has been increased via the removal of a thick component, of a composite spacer, comprising the steps of:

providing silicon nitride capped, gate structures, on a silicon dioxide gate insulator layer;

forming a lightly doped source/drain region, in an area of said semiconductor substrate, not covered by said silicon nitride capped, gate structures;

forming a thin silicon oxide layer on the sides of a polysilicon component of said silicon nitride capped, gate structures, and on the top surface of said lightly doped source drain region;

depositing a polysilicon layer;

performing an anisotropic RIE procedure to create a polysilicon spacer shape, resulting in a composite spacer on the sides of said silicon nitride capped, gate structures, comprised of an overlying, said polysilicon spacer shape, and an underlying thin silicon oxide shape, obtained from a first portion of said thin silicon oxide that was located on the sides of the polysilicon component of the silicon nitride capped, gate structures, and with a second portion of said thin silicon oxide shape, still remaining between said silicon nitride capped, gate structures;

forming a heavily doped source/drain region in an area of said semiconductor substrate, not covered by said silicon nitride capped, gate structures, or by said composite spacers;

depositing a disposable first silicon nitride layer over said silicon nitride capped, gate structures, said composite spacers, and said heavily doped source/drain region;

depositing an interlevel dielectric layer (ILD) over said disposable silicon nitride layer;

planarizing said ILD layer;

forming a SAC opening in said ILD layer, wherein said SAC opening stops at said disposable first silicon nitride layer and thereby exposing portions of said disposable first silicon nitride layer within said SAC opening;

selectively removing said exposed portions of said disposable first silicon nitride layer;

selectively removing said polysilicon spacer shape, resulting in a widening of said SAC opening;

depositing a second silicon nitride layer;

forming a silicon nitride spacer on the sides of said SAC opening;

removing said second portion of said thin silicon oxide layer, exposed at the bottom of said SAC opening; and forming a SAC structure, in said SAC opening.

14. The method of claim 13, wherein said thin silicon oxide layer, formed on the sides of the polysilicon component of said silicon nitride capped, gate structures, and formed on the top surface of said lightly doped source/drain region, is formed via thermal oxidation procedures, to a thickness between about 100 to 200 Angstroms.

15. The method of claim 13, wherein said polysilicon layer is obtained via LPCVD procedures, at a thickness between about 500 to 1500 Angstroms.

16. The method of claim 13, wherein said polysilicon spacer shape, is formed via an anisotropic RIE procedure, applied to said polysilicon layer, using $Cl_2$ as an etchant.

17. The method of claim 13, wherein said first silicon nitride layer is obtained via LPCVD or PECVD procedures, at a thickness between about 100 to 400 Angstroms.

18. The method of claim 13, wherein said ILD layer is comprised of an underlying silicon oxide layer, obtained via PECVD procedures, at a thickness between about 1000 to 2000 Angstroms, using TEOS as a source, and comprised of an overlying layer of borophosphosilicate glass, obtained via PECVD procedures, at a thickness between about 3000 to 12000 Angstroms, using TEOS as a source.

19. The method of claim 13, wherein said SAC opening is formed in said ILD layer, using $CHF_3$ as an etchant, with an etch rate ratio of said ILD layer, to said first silicon nitride layer, of about 15 to 1.

20. The method of claim 13, wherein said SAC opening is formed in said first silicon nitride layer, using $CHF_3$—Ar as an etchant, with an etch rate ratio of said first silicon nitride layer, to said thin silicon oxide layer, between about 5 to 10, to 1.

21. The method of claim 13, wherein said polysilicon spacer shape is removed via a blanket isotropic dry etching procedure, using $Cl_2$ as an etchant.

22. The method of claim 13, wherein said second silicon nitride layer is obtained via LPCVD or PECVD procedures, at a thickness between about 50 to 300 Angstroms.

* * * * *